United States Patent
Kim et al.

(10) Patent No.: US 11,836,005 B2
(45) Date of Patent: Dec. 5, 2023

(54) DISPLAY DEVICE INCLUDING AN LED MODULE ASSEMBLY FOR ELECTROMAGNETIC WAVE ATTENUATION

(71) Applicant: SAMSUNG ELECTRONICS CO., LTD., Suwon-si (KR)

(72) Inventors: Yoon Ah Kim, Suwon-si (KR); Sang Ki Yoon, Suwon-si (KR); Nguyen Huu Lam Vuong, Suwon-si (KR); Jin Jung, Suwon-si (KR); Kwang Sung Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 382 days.

(21) Appl. No.: 17/270,784

(22) PCT Filed: Jan. 10, 2019

(86) PCT No.: PCT/KR2019/000405
§ 371 (c)(1),
(2) Date: Feb. 23, 2021

(87) PCT Pub. No.: WO2020/040371
PCT Pub. Date: Feb. 27, 2020

(65) Prior Publication Data
US 2021/0335885 A1  Oct. 28, 2021

Related U.S. Application Data

(60) Provisional application No. 62/721,854, filed on Aug. 23, 2018.

(30) Foreign Application Priority Data

Nov. 5, 2018  (KR) .......................... 10-2018-0134486

(51) Int. Cl.
*G06F 1/16* (2006.01)
*H01L 23/552* (2006.01)
(Continued)

(52) U.S. Cl.
CPC .......... *G06F 1/1647* (2013.01); *G09F 9/3026* (2013.01); *H01L 23/552* (2013.01); *H01L 33/62* (2013.01)

(58) Field of Classification Search
CPC ........ G09F 9/3026; G09F 9/33; G06F 3/1446; G06F 1/1601; G06F 1/1647; H05K 5/0017; G09G 2300/026
See application file for complete search history.

(56) References Cited

U.S. PATENT DOCUMENTS

| 8,159,477 B2 * | 4/2012 | Cho ..................... H05K 9/0096 361/817 |
| 2016/0231976 A1 * | 8/2016 | Ryu ..................... G06F 3/1446 |

(Continued)

FOREIGN PATENT DOCUMENTS

| KR | 1020060121617 A | 11/2006 |
| KR | 1020070076830 A | 7/2007 |

(Continued)

OTHER PUBLICATIONS

International Search Report (PCT/ISA/210) dated May 23, 2019, issued by the International Searching Authority in International Application No. PCT/KR2019/000405.
(Continued)

*Primary Examiner* — James Wu
(74) *Attorney, Agent, or Firm* — Sughrue Mion, PLLC

(57) ABSTRACT

Disclosed is a display apparatus having an improved structure to attenuate electromagnetic interference. The display apparatus may include a cabinet and an LED module assembly detachably disposed in the cabinet, wherein the LED (Continued)

module assembly may include a plurality of LED modules, a support frame on which the plurality of LED modules are disposed, and a coupling member configured to couple the plurality of LED modules to the support frame and to include a conductive region.

6 Claims, 6 Drawing Sheets

(51) Int. Cl.
*H01L 33/62* (2010.01)
*G09F 9/302* (2006.01)

(56) References Cited

U.S. PATENT DOCUMENTS

2017/0102485 A1* 4/2017 Ha .......................... G09F 13/22
2017/0105293 A1* 4/2017 Kim ..................... H05K 5/0021

FOREIGN PATENT DOCUMENTS

| KR | 1020080037243 A | 4/2008 |
| KR | 1020130072608 A | 7/2013 |
| KR | 1020160097599 A | 8/2016 |
| KR | 1020180011983 A | 2/2018 |

OTHER PUBLICATIONS

Written Opinion (PCT/ISA/237) dated May 23, 2019, issued by the International Searching Authority in International Application No. PCT/KR2019/000405.

Communication dated Jan. 14, 2020, issued by the Korean Intellectual Property Office in Korean Patent Application No. 10-2018-0134486.

* cited by examiner though the coupling member including the conductive region, it is possible to provide an effect of minimizing EMI occurring inside the display apparatus.

DISPLAY DEVICE INCLUDING AN LED MODULE ASSEMBLY FOR ELECTROMAGNETIC WAVE ATTENUATION

CROSS-REFERENCE TO RELATED APPLICATION

This application is based on and claims priority under 35 U.S.C. § 119 to United States Patent Application No. 62/721,854, filed on Aug. 23, 2018 and Korean Patent Applications No. 10-2018-0134486, filed on Nov. 5, 2018 in the Korean Intellectual Property Office, the disclosures of which are incorporated herein by reference.

TECHNICAL FIELD

The disclosure relates to a display apparatus, and more particularly, to a display apparatus having an improved structure to reduce electromagnetic interference.

BACKGROUND ART

A display apparatus is a type of output apparatus that visually displays data information and images such as characters and figures, and demands for high luminance, high resolution, large size, high efficiency, and low power of the display apparatus are continuously increasing.

Accordingly, OLED (Organic Light Emitting Diode) panels are in the spotlight as a new display apparatus to replace LCD (Liquid Crystal Display) panels, but OLED panels still have problems to be solved, such as high price due to low mass production yield, securing reliability due to large size, and securing durability according to external environment such as moisture.

As a new product to replace or complement such LCD panels and OLED panels, research on technology to make panels by directly mounting inorganic light emitting apparatus that emit colors of R (red), G (green), and B (blue) on a substrate Is being tried.

Various electronic apparatus for driving the display apparatus may be mounted inside the display apparatus.

When the display apparatus is operated, electromagnetic waves may be generated from various electronic apparatus inside the display apparatus, and electromagnetic waves generated from various electronic apparatus may cause electromagnetic interference (EMI) with each other, thereby causing malfunction of the display apparatus.

In addition, when electromagnetic waves generated inside the display apparatus are not shielded and are radiated to the outside of the display apparatus, it may cause electromagnetic interference with other electronic apparatus and adversely affect the human body.

SUMMARY

Therefore, it is an object of the disclosure to provide a display apparatus configured to include an improved structure to minimize electromagnetic interference while simultaneously coupling a plurality of LED modules to a support frame.

In accordance with an aspect of the disclosure, there is provided a display apparatus including: a cabinet and an LED module assembly detachably disposed in the cabinet, wherein the LED module assembly may include a plurality of LED modules, a support frame on which the plurality of LED modules are disposed, and a coupling member configured to couple the plurality of LED modules to the support frame and to include a conductive region.

The plurality of LED modules may include a plating processing region, and the plating processing region of the plurality of LED modules may contact the conductive region of the coupling member.

The plurality of LED modules may further include a corresponding surface of the support frame facing the support frame, and the plating processing region may be formed on the corresponding surface of the support frame.

The plating processing region may be formed along an edge of the corresponding surface of the support frame.

The coupling member may further include non-conductive regions adjacent to the conductive region.

The coupling member may include a double-sided tape.

The display apparatus according to the idea of the disclosure may further include an receiving space formed between the cabinet and the LED module assembly, and a control board disposed in the receiving space to drive the plurality of LED modules.

The display apparatus according to the idea of the present invention may further include an electromagnetic wave attenuator formed by contacting the plating processing region of the plurality of LED modules and the conductive region of the coupling member to attenuate electromagnetic waves generated from at least one of the LED module assembly or the control board.

The LED module assembly may further include a connector provided on the corresponding surface of the support frame of the plurality of LED modules so that the plurality of LED modules are electrically connected to the control board.

The support frame may include a corresponding holes of a connector formed at a position corresponding to the connector so that the connector is exposed to the receiving space.

The display apparatus according to the idea of the disclosure may include a cabinet; an LED module assembly detachably disposed in the cabinet, wherein the LED module assembly may include a plurality of LED modules, a support frame on which the plurality of LED modules are disposed, and a coupling member configured to couple the plurality of LED modules to the support frame and to include a conductive region; an receiving space formed between the cabinet and the LED module assembly; a control board disposed in the receiving space to drive the plurality of LED modules; and an electromagnetic wave attenuator defined by the plurality of LED modules and the coupling member to attenuate electromagnetic waves generated from at least one of the LED module assembly and the control board.

The coupling member may include a conductive region.

The plurality of LED modules may include a plating processing region in contact with the conductive region of the coupling member, and the electromagnetic wave attenuator may be formed by contacting the conductive region of the coupling member and the plating processing region of the plurality of LED modules.

The coupling member may further include non-conductive regions adjacent to the conductive region.

The coupling member may include a double-sided tape including a first adhesive surface coupled to the plurality of LED modules and a second adhesive surface coupled to the support frame.

The plating processing region may be formed along edges of the plurality of LED modules.

Electromagnetic waves generated from the display apparatus may be effectively shielded through an electromagnetic wave attenuator generated by contact between the plating processing region of the plurality of LED modules and the conductive region of the coupling member.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Hereinafter, preferred embodiments according to the disclosure will be described in detail with reference to the accompanying drawings.

Meanwhile, the terms "front", "rear", "upper", "lower", "upper" and "lower" used in the following description are defined based on the drawings, and the shape and position of each component are not limited by this term.

Figure 1:
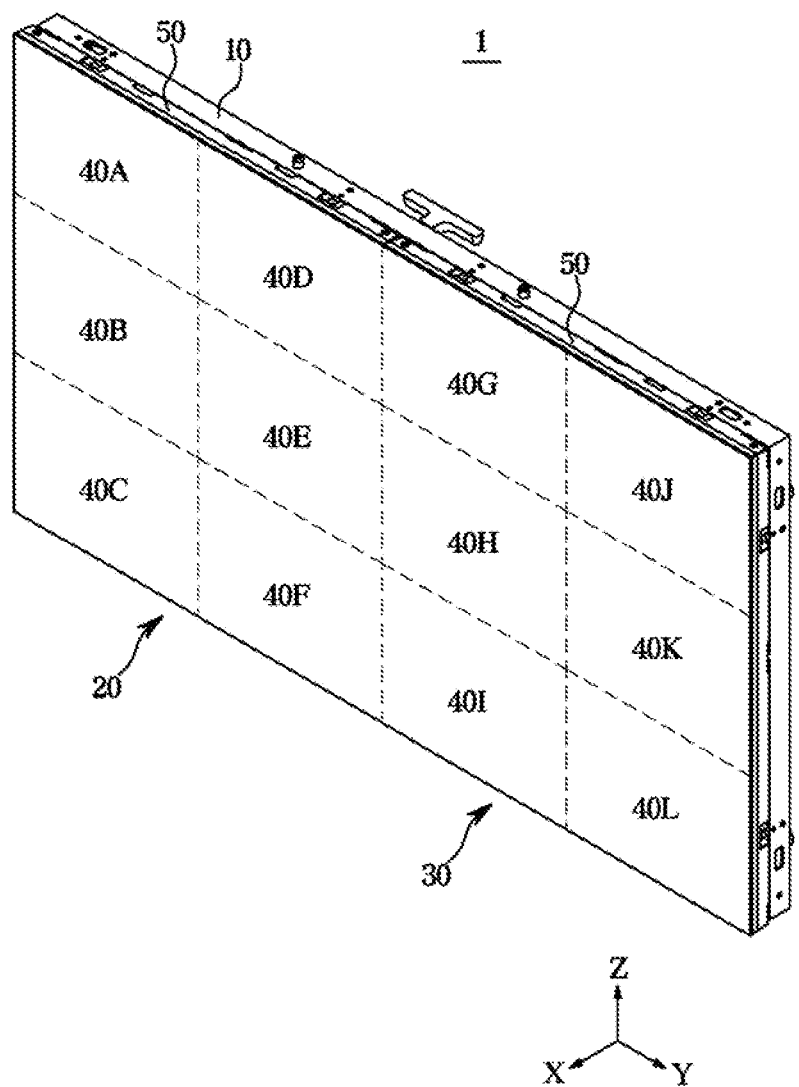
FIG. 1 is a perspective view illustrating a display apparatus according to an embodiment of the disclosure.

FIG. 1 is a perspective view illustrating a display apparatus according to an embodiment of the disclosure. For reference, in FIG. 1, "X" refers to the front and rear directions of the display apparatus, "Y" refers to the left and right directions of the display apparatus, and "Z" refers to the vertical direction of the display apparatus.

As shown in FIG. 1, the display apparatus 1 is a device that displays information, source, data, etc. as characters, figures, graphs, images, etc., and a TV, PC, mobile, digital signage, etc. may be implemented as a display apparatus.

The display apparatus 1 may be installed on the ground by a stand (not shown) or may be installed on a wall.

The display apparatus 1 may include a cabinet 10 and a plurality of LED module assemblies 20 and 30 installed in the cabinet 10. Each of the plurality of LED module assemblies 20 and 30 may include a support frame 50 disposed on the cabinet 10 and a plurality of LED modules 40A-40L installed on the support frame 50. Specifically, any one 20 of the plurality of LED module assemblies may include a plurality of LED modules 40A-40F, and the other one 30 of the plurality of LED module assemblies may include a plurality of LED modules 40G-40L.

The cabinet 10 may form a part of the exterior of the display apparatus 1.

The cabinet 10 may include a cabinet body 11 (refer to FIG. 2) forming the rear appearance of the display apparatus 1 and an edge portion 12 (refer to FIG. 2) extending from the cabinet body 11 toward the front of the display apparatus 1. The plurality of LED modules 40A-40L installed on the support frame 50 may implement a screen of the display apparatus 1.

The plurality of LED modules 40A-40L may be arranged in the form of an M*N matrix vertically and horizontally so as to be adjacent to each other.

In this embodiment, twelve of the plurality of LED modules 40A-40L are installed on the support frame 50 in the form of a 3*4 matrix, but the number or arrangement of the plurality of LED modules is not limited to the above example and can be variously changed. In this embodiment, a plurality of LED modules 40A-40L may be installed on two support frames 50.

Specifically, some 40A-40F of the plurality of LED modules 40A-40L may be installed on the support frame 50 of any one 20 of the plurality of LED module assemblies 20, and some of the remaining 40G-40L the plurality of LED modules 40A-40L may be installed on the support frame 50 of the other 30 of the plurality of LED module assemblies. However, the number of support frames is not limited to the above example and can be variously changed.

The edge portion 52 (refer to FIG. 2) of the support frame 50 may be disposed in the cabinet 10 to be exposed to the outside.

The edge portion 52 of the support frame 50 may form the top, bottom, and side exteriors of the display apparatus 1 together with the edge portion 12 of the cabinet 10. In this embodiment, the support frame 50 may be disposed in the cabinet 10 so as to be exposed to the outside of the display apparatus 1, but the support frame 50 may be disposed on the cabinet 10 so as not to be exposed to the outside of the display apparatus 1.

The plurality of LED modules 40A-40L may have a planar shape or a curved shape. Furthermore, it may be provided so that the curvature is variable.

Figure 2:
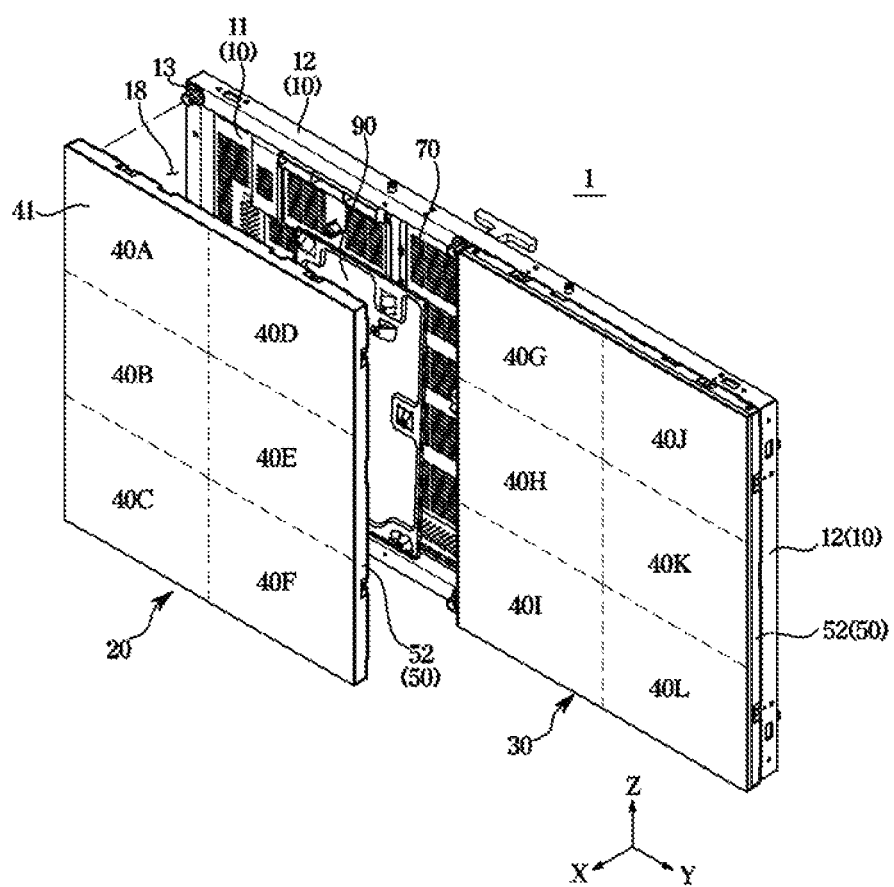
FIG. 2 is a perspective view illustrating a state in which one LED module assembly is separated from a cabinet in the display apparatus according to an embodiment of the disclosure.

FIG. 2 is a perspective view illustrating a state in which one LED module assembly is separated from a cabinet in the display apparatus according to an embodiment of the disclosure.

As illustrated in FIG. 2, a plurality of LED module assemblies 20 and 30 may be detachably disposed in the cabinet 10. In other words, the plurality of LED module assemblies 20 and 30 may be detachably coupled to the cabinet 10.

A first coupling portion 13 and a second coupling portion 23 may be provided on the cabinet 10 and the support frame 50 of the plurality of LED module assemblies 20 and 30, respectively. The cabinet 10 and the plurality of LED module assemblies 20 and 30 may be coupled to each other by coupling between the first coupling portion 13 of the cabinet 10 and the second coupling portion 23 of the support frame 50. The first coupling portion 13 and the second coupling portion 23 may be coupled to each other through various known methods such as magnetic force using a magnet or a mechanical fitting structure.

A cover 70 may be detachably installed in the cabinet 10 to facilitate access to a power cable (not shown). The cover 70 may be detachably installed on the cabinet body 11 to facilitate access to the power cable located on the rear and outer sides of the cabinet 10. The cover 70 may be installed to be completely detachable from the cabinet body 11 or may be installed rotatably on the cabinet body 11. However, it is sufficient if the cover 70 is installed so that access to the power cable is possible, and the installation structure of the cover 70 is not limited to the above example.

The display apparatus 1 may further include an receiving space 18 defined by a cabinet 10 and a plurality of LED module assemblies 20 and 30 detachably coupled to the cabinet 10. The receiving space 18 may be formed between the cabinet 10 and a plurality of LED module assemblies 20 and 30 detachably coupled to the cabinet 10.

The display apparatus 1 may further include electronic apparatus involved in driving the plurality of LED modules 40A-40L.

As an example, the electronic apparatus may include a control board 90. The electronic apparatus may be disposed in the receiving space 18.

Figure 3:
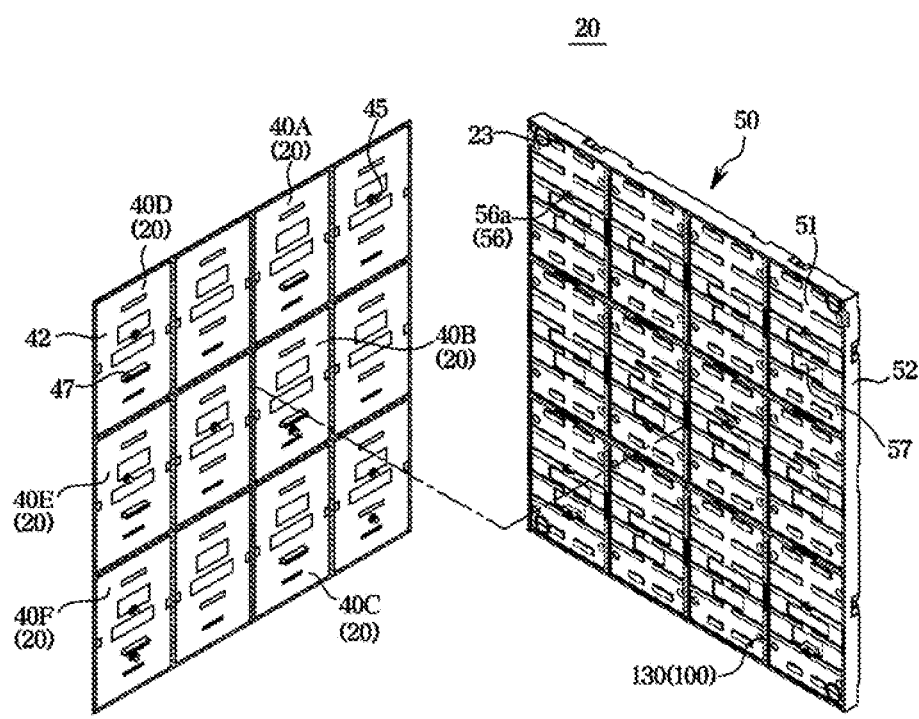
FIG. 3 is an exploded perspective view of an LED module assembly of a display apparatus according to an embodiment of the disclosure.
Figure 4:
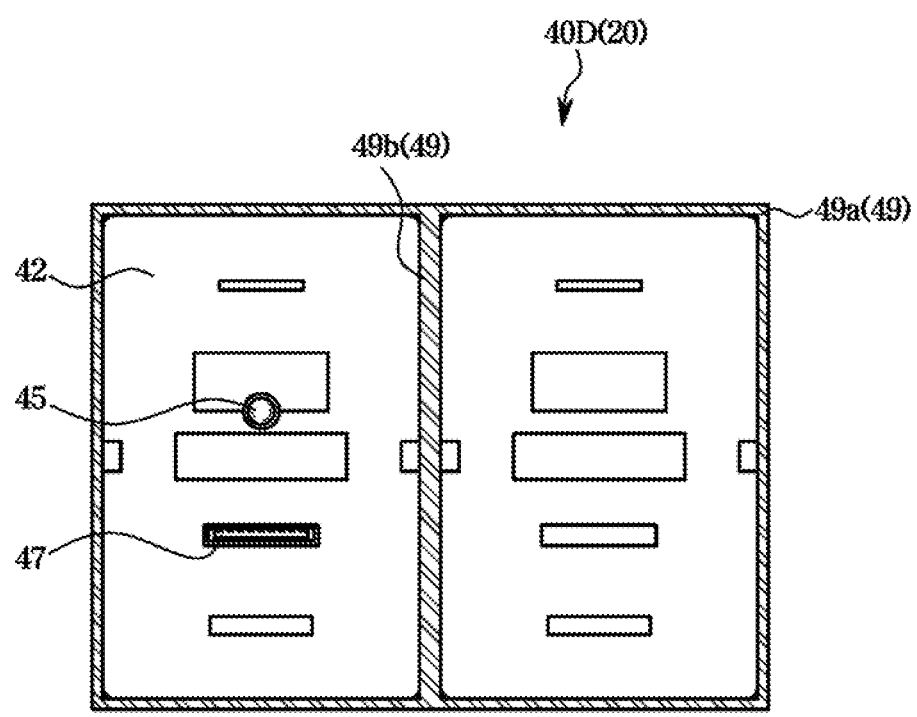
FIG. 4 is an enlarged view of a part of FIG. 3.
Figure 5:
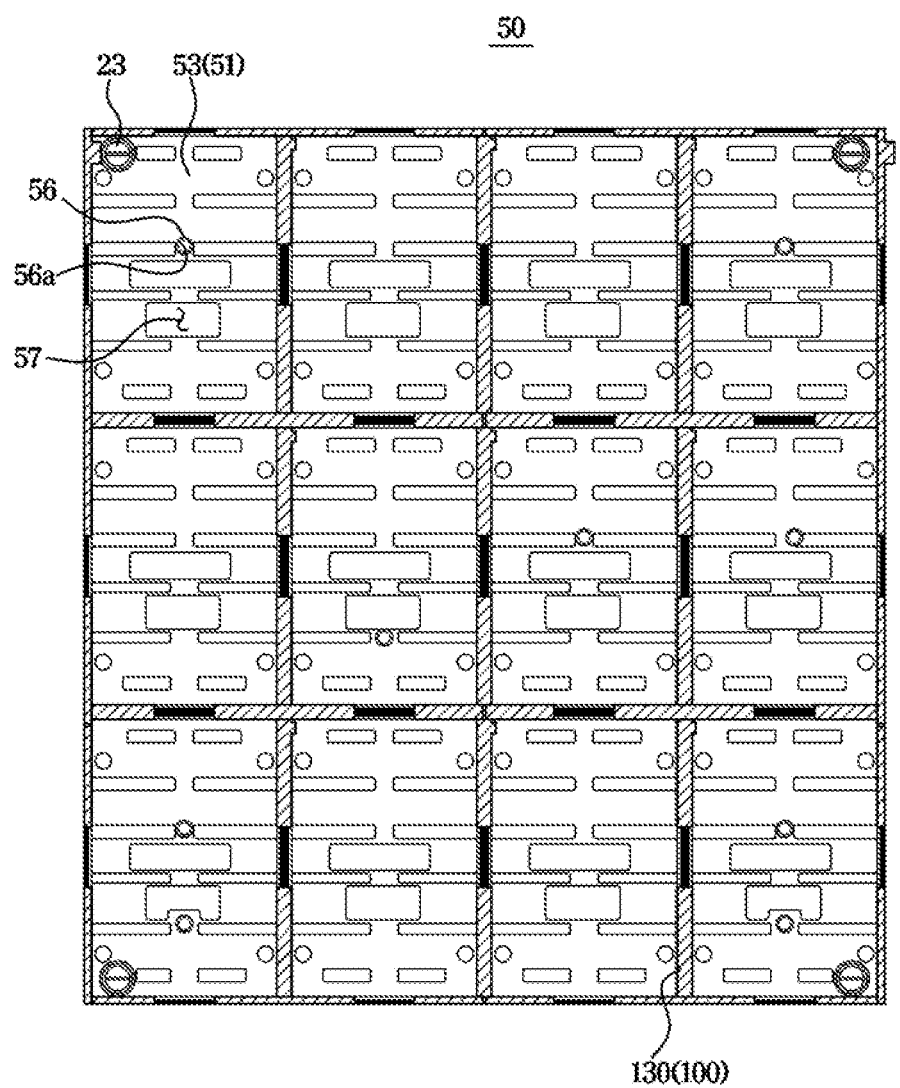
FIG. 5 is a view illustrating a support frame of a display apparatus according to an embodiment of the disclosure.
Figure 6:
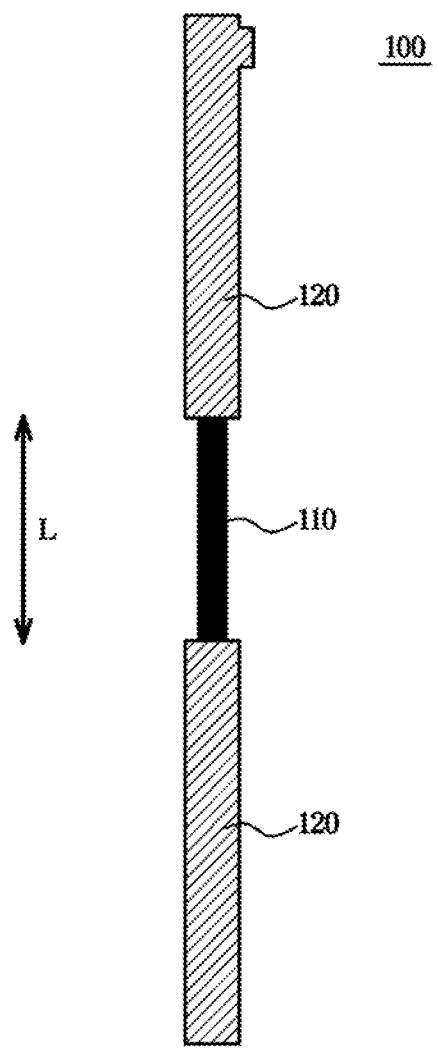
FIG. 6 is a view illustrating a coupling member of the display apparatus according to an embodiment of the disclosure.

FIG. 3 is an exploded perspective view of an LED module assembly of a display apparatus according to an embodiment of the disclosure, FIG. 4 is an enlarged view of a part of FIG. 3, FIG. 5 is a view illustrating a support frame of a display apparatus according to an embodiment of the disclosure, and FIG. 6 is a view illustrating a coupling member of the display apparatus according to an embodiment of the disclosure. Hereinafter, the second surface 42 of the plurality of LED modules 40A-40L may refer to the same surface as the corresponding surface 42 of the support frame.

As illustrated in FIGS. 3 to 6, each of the plurality of LED module assemblies 20 and 30 may further include a coupling member 100 for coupling the plurality of LED modules 40A-40L to the support frame 50. As an example, the coupling member 100 may include a double-sided tape. The type of the coupling member 100 is not limited to the double-sided tape, but in this embodiment, a case where the double-sided tape is used as the coupling member 100 will be mainly described. The coupling member 100 may be disposed between the plurality of LED modules 40A-40L and the support frame 50 to couple the plurality of LED modules 40A-40L and the support frame 50 to each other. The coupling member 100 may not only couple the plurality of LED modules 40A-40L and the support frame 50 to each other, but may also serve to attenuate electromagnetic interference generated inside the display apparatus 1.

The coupling member 100 may include a first adhesive surface 130 coupled to the plurality of LED modules 40A-40L and a second adhesive surface coupled to the support frame 50. Specifically, the coupling member 100 may include a first adhesive surface 130 coupled to the second surface 42 of the plurality of LED modules 40A-40L and a second adhesive surface coupled to the first surface 53 of the support frame 50.

The coupling member 100 may include a conductive region 110. As an example, the conductive region 110 may be made of a metal having good electrical conductivity. As another example, the conductive region 110 may be formed of a fiber coated with a metal having good electrical conductivity. However, the method of configuring the conductive region 110 is not limited to the above example and may be variously changed. The coupling member 100 may further include non-conductive regions 120 adjacent to the conductive region 110. The conductive region 110 may be provided between the non-conductive regions 120. In other words, the conductive region 110 and the non-conductive regions 120 may be alternately provided with each other in the longitudinal direction L of the coupling member 100. The arrangement structure of the conductive region 110 and the non-conductive regions 120 is not limited to the above example and may be variously changed. In the above description, the case where the coupling member 100 includes the conductive region 110 and the non-conductive regions 120 has been mainly described, but the coupling member 100 may be composed of only the conductive region 110.

Each of the plurality of LED modules 40A-40L may include a first surface 41 (see FIG. 2) forming a screen of the display apparatus 1 and a second surface 42 located on the opposite side of the first surface 41 and facing the support frame 50.

Each of the plurality of LED modules 40A-40L may include a plating processing region 49. The plating processing region 49 of the plurality of LED modules 40A-40L may contact the conductive region 110 of the coupling member 100. The plating processing region 49 of the plurality of LED modules 40A-40L and the conductive region 110 of the coupling member 100 may form an electromagnetic wave attenuator to be described later.

The plating processing region 49 of the plurality of LED modules 40A-40L may be formed on the second surface 42 of the plurality of LED modules 40A-40L. Specifically, the plating processing region 49 may be formed along the edge of the second surface 42 of the plurality of LED modules 40A-40L. The plating processing region 49 may be further formed inside the second surface 42 of the plurality of LED modules 40A-40L. In other words, each of the plurality of LED modules 40A-40L may includes a first plating processing region 49a formed along the edge of the second surface 42 of each of the plurality of LED modules 40A-40L and a second plating processing region 49b formed inside the second surface 42 of the plurality of LED modules 40A-40L.

As an example, the second plating processing region 49b may be formed inside the second surface 42 of each of the plurality of LED modules 40A-40L so that the second surface 42 of each of the plurality of LED modules can be divided into a plurality of areas. Preferably, the second plating processing region 49b may be formed in the center of the second surface 42 of each of the plurality of LED modules 40A-40L so that the second surface 42 of each of the plurality of LED modules 40A-40L can be divided into two areas. However, the formation position of the plating processing region 49 is not limited to the above example and can be variously changed.

The display apparatus 1 may further include a electromagnetic wave attenuator provided to attenuate electromagnetic waves generated from at least one of the LED module assemblies 20 and 30 and electronic apparatus.

The electromagnetic wave attenuator may be defined by a plurality of LED modules 40A-40L and the coupling member 100. Specifically, the electromagnetic wave attenuator may be formed by contacting the plating processing region 49 of the plurality of LED modules 40A-40L and the conductive region 110 of the coupling member 100.

The electromagnetic wave attenuator may be provided to attenuate electromagnetic waves generated from at least one of the LED module assemblies 20 and 30 and the electronic apparatus disposed in the receiving space 18. As an example, the electronic apparatus may include a control board 90 disposed inside the receiving space 18. The electromagnetic wave attenuator may attenuate or shield electromagnetic waves generated inside the display apparatus 1 to prevent electromagnetic waves generated inside the display apparatus 1 from being emitted to the outside of the display apparatus 1.

The plurality of LED modules 40A-40L may be electrically connected to the control board 90.

The plurality of LED module assemblies 20 and 30 may further include a connector 47 formed on the second surface 42 of the plurality of LED modules 40A-40L so that the plurality of LED modules 40A-40L can be electrically connected to the control board 90.

The plurality of LED module assemblies 20 and 30 may further include a protrusion 45 formed on one surface of the plurality of LED modules 40A-40L facing the support frame 50. In other words, the plurality of LED modules 40A-40L may include a protrusion 45 formed on the second surface 42 of the plurality of LED modules 40A-40L. The protrusion 45 may be formed on at least one second surface 42 of the plurality of LED modules 40A-40L. The protrusions 45 of the plurality of LED modules 40A-40L may be coupled to the coupling holes 56 of the support frame 50. As an example, the protrusion 45 may include metal. The protrusion 45 may guide the coupling between the plurality of LED modules 40A-40L and the support frame 50 through the coupling with the coupling holes 56.

The support frame 50 may include a support frame body 51 and an edge portion 52 extending from the support frame body 51 toward the rear of the display apparatus 1. The support frame 50 may further include a first surface 53 facing the plurality of LED modules 40A-40L and a second surface 54 located on the opposite side of the first surface 53 and facing the cabinet body 11. The plurality of LED modules 40A-40L may be adhered or coupled on the first surface 53 of the support frame 50 by the coupling member 100. In this case, the first surface 53 of the support frame 50 may refer to the same surface as the front surface of the support frame 50.

The support frame 50 may further include corresponding holes 57 of a connector formed at a position corresponding to the connector 47 so that the connector 47 can be exposed to the receiving space 18. The corresponding holes 57 of the connector may have a shape corresponding to the connector 47, and the number of the corresponding holes 57 of the connector may correspond to the number of connectors 47.

The support frame 50 may further include coupling holes 56 through which the protrusions 45 of the plurality of LED modules 40A-40L are coupled through. The coupling holes 56 may be formed in the support frame body 51. A thread 56a may be formed on the inner circumferential surface of the coupling holes 56.

The plurality of LED modules 40A-40L coupled to the first surface 53 of the support frame 50 by the coupling member 100 may be separated from the support frame 50 by a pressing apparatus (not shown). Specifically, the LED module assembly 20 separated from the cabinet 10 may be turned over so that the second surface 54 of the support frame 50 is visible.

At this time, the protrusions 45 of the plurality of LED modules 40A-40L penetrating through the coupling holes 56 of the support frame 50 may be pressed by a pressing apparatus. The pressing apparatus may include a jig. When pressing the protrusions 45 of the plurality of LED modules 40A-40L penetrating through the coupling holes 56 of the support frame 50 using a pressing apparatus with a force greater than the coupling force of the coupling member 100, the plurality of LED modules (40A-40L) may be separated from the support frame (50).

The pressing apparatus may include a thread (not shown) corresponding to the thread 56a formed on the inner circumferential surface of the coupling holes 56. The pressing apparatus is rotated in a state in which the thread of the pressing apparatus and the thread 56a of the coupling holes 56 are engaged to press the protrusion 45 of the plurality of LED modules 40A-40L.

As described above, the disclosed embodiments have been described with reference to the accompanying drawings. Although example embodiments of the disclosure have been shown and described, it would be appreciated by those skilled in the art that changes may be made to these embodiments without departing from the principles and spirit of the disclosure, the scope of which is defined in the claims and their equivalents.

What is claimed is:

1. An display apparatus comprising:
   a cabinet; and
   an LED module assembly detachably disposed in the cabinet;
   wherein the LED module assembly comprises:
   a plurality of LED modules;
   a support frame on which the plurality of LED modules are disposed; and
   a coupling member configured to couple the plurality of LED modules to the support frame and to include a conductive region,
   wherein the plurality of LED modules comprises a corresponding surface facing the support frame and a plating processing region formed along an edge of the corresponding surface,
   wherein the coupling member comprises a non-conductive region alternately provided with the conductive region, and
   wherein the plating processing region contact the conductive region of the coupling member to attenuate electromagnetic waves generated from the LED module assembly.

2. The display apparatus of claim 1, wherein the coupling member comprises a double-sided tape.

3. The display apparatus of claim 1, further comprising:
   an receiving space formed between the cabinet and the LED module assembly; and
   a control board disposed in the receiving space to drive the plurality of LED modules.

4. The display apparatus of claim 3, further comprising:
   an electromagnetic wave attenuator formed by contacting the plating processing region of the plurality of LED modules and the conductive region of the coupling member to attenuate electromagnetic waves generated from at least one of the LED module assembly or the control board.

5. The display apparatus of claim 3, wherein each of the LED modules comprises a connector provided on the surface corresponding to the support frame of the plurality of LED modules so that the plurality of LED modules are electrically connected to the control board.

6. The display apparatus of claim 5, wherein the support frame further comprises a corresponding holes formed at a position corresponding to the connector so that the connector is exposed to the receiving space.

\* \* \* \* \*